(12) United States Patent
Chao et al.

(10) Patent No.: US 7,447,039 B2
(45) Date of Patent: Nov. 4, 2008

(54) MOTHERBOARD CONFIGURED TO MINIMIZE OR PREVENT DAMAGE TO A CHIP THEREON

(75) Inventors: Chih-Hang Chao, Tu-Cheng (TW); Yu-Hsu Lin, San Jose, CA (US); Jeng-Da Wu, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,887

(22) Filed: Oct. 17, 2006

(65) Prior Publication Data

US 2008/0089032 A1 Apr. 17, 2008

(51) Int. Cl.
 *H05K 1/00* (2006.01)
(52) U.S. Cl. .................... 361/748; 361/709
(58) Field of Classification Search ............... 361/704, 361/719, 709, 748, 784
 See application file for complete search history.

(56) References Cited

U.S. PATENT DOCUMENTS

| 6,888,725 | B2 * | 5/2005 | Kubo et al. ............... 361/719 |
| 2002/0159237 | A1 * | 10/2002 | Patel et al. ............... 361/719 |
| 2003/0169567 | A1 * | 9/2003 | Tantoush et al. ......... 361/695 |
| 2004/0095719 | A1 * | 5/2004 | Rong-Yao ................. 361/687 |

* cited by examiner

*Primary Examiner*—Dean A. Reichard
*Assistant Examiner*—Abiy Getachew
(74) *Attorney, Agent, or Firm*—Wei Te Chung

(57) ABSTRACT

A motherboard includes a circuit board, a first chip and a second chip disposed on the circuit board. Four securing holes are defined in the circuit board around the first chip, for mounting a heat dissipating module on the first chip. Two of the securing holes determine a first line, and the other two securing holes determine a second line parallel to the first line. A center of the second chip is located along a centerline between the first and second lines. Should the circuit board suffer from an impact, damage to the chips may be effectively minimized or prevented.

7 Claims, 2 Drawing Sheets

MOTHERBOARD CONFIGURED TO MINIMIZE OR PREVENT DAMAGE TO A CHIP THEREON

FIELD OF THE INVENTION

The present invention relates to motherboards, more particularly to a motherboard configured to minimize or prevent damage to a semiconductor chip on a circuit board when the circuit board suffers an impact.

DESCRIPTION OF RELATED ART

In the design process of a motherboard, stability of chips on the motherboard is a prime concern. In manufacturing of a motherboard, semiconductor chips are usually mounted on a printed circuit board via tin balls. A conventional tin ball is made with lead. Because of good capability of lead for resisting shock, the tin ball is not easily damaged. However, due to the dangers of leaded tin balls polluting the environment and damaging health of people, nonleaded tin balls are now commonly used in the process of mounting a semiconductor chip to a printed circuit board. However, because of the poor capability of non-leaded tin balls to resist shock, they are easily damaged when the printed circuit board suffers an impact, thereby affecting performance of chips on the motherboard. Referring to FIG. 1, a conventional motherboard structure is usually used. When non-leaded tin balls are applied in the conventional motherboard, aforesaid things usually happen.

What is needed, therefore, is a new motherboard structure which provides good performance of a semiconductor chip in a circuit board even after the circuit board suffers an impact.

SUMMARY OF THE INVENTION

A motherboard includes a circuit board, a first chip and a second chip disposed on the circuit board. Four securing holes are defined in the circuit board around the first chip, for mounting a heat dissipating module on the first chip. Two of the securing holes determine a first line, and the other two securing holes determine a second line parallel to the first line. A center of the second chip is located along a centerline between the first and second lines. Should the circuit board suffer from an impact, quality of the chips on the circuit board is ensured because the location of the chips is away from the position where stress focuses on the circuit board during an impact.

Other advantages and novel features will be drawn from the following detailed description of preferred embodiments with attached drawings, in which:

DETAILED DESCRIPTION OF THE INVENTION

Figure 2:
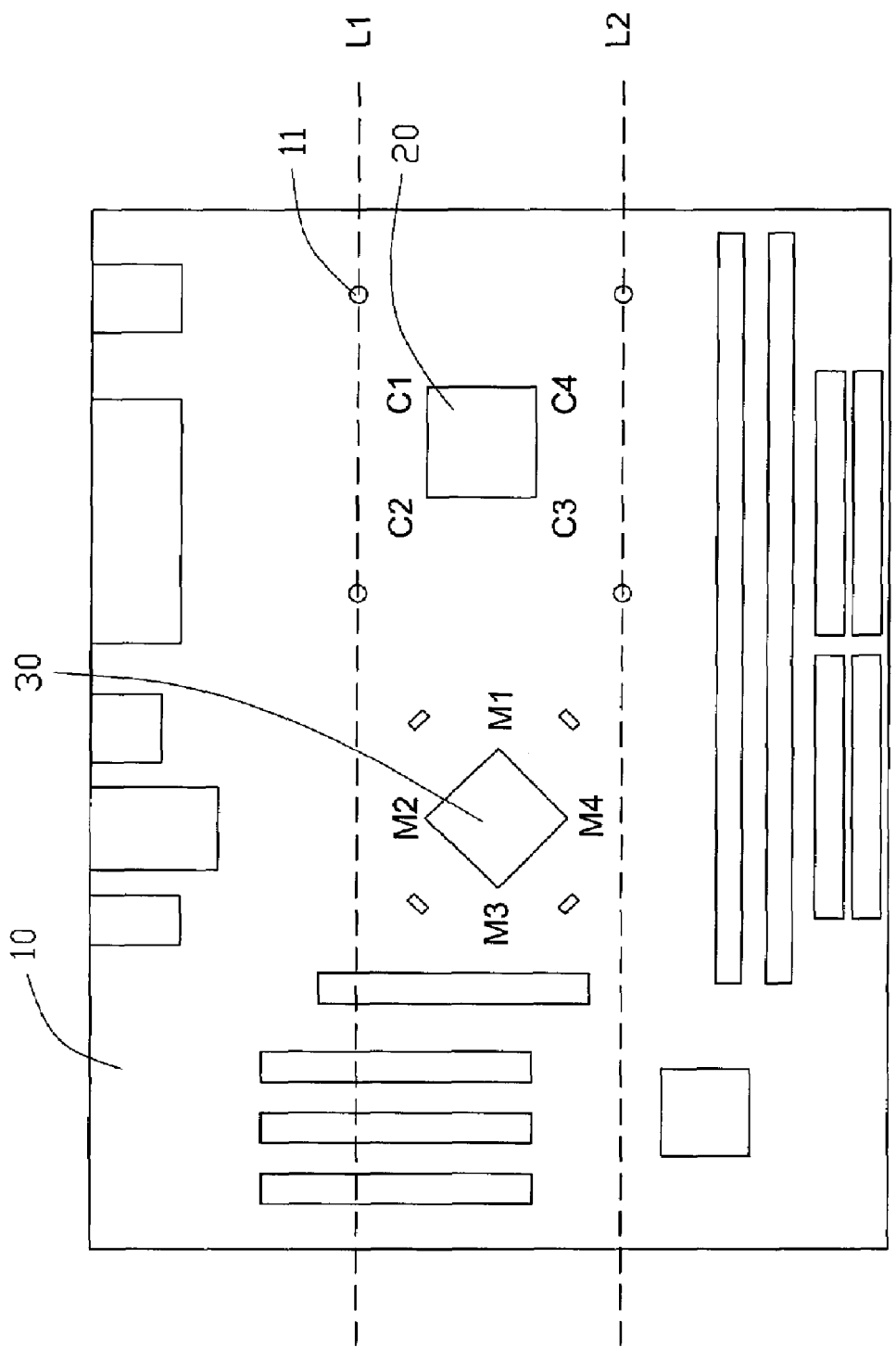
FIG. 2 is a top view of a motherboard in accordance with the preferred embodiment of the present invention.

Referring to FIG. 2, the motherboard in accordance with the present invention includes a printed circuit board (PCB) 10, a first chip mounted on the PCB 10, such as a central processing unit (CPU) chip 20, and a second chip mounted on the PCB 10, such as a north bridge chip 30. The CPU chip 20 and north bridge chip 30 are respectively jointed to the PCB 10 via a plurality of tin balls. Four securing holes 11 are defined in the PCB 10 around the CPU chip 20, for securing a heat dissipating module (not shown) on the CPU chip 20. A first line L1 determined by two adjacent holes 11 is parallel to a second line L2 determined by the other two holes 11. The CPU chip 20 is centrally located between the parallel lines L1 and L2. The CPU chip 20 is square or rectangular, including four corners C1, C2, C3, and C4. One side of the CPU chip 20 determined by the corners C1 and C2 and another side determined by the corners C3 and C4 are parallel to the lines L1 and L2. The north bridge chip 30 is also square or rectangular, including four corners M1, M2, M3, and M4. The north bridge chip 30 is centrally located between the lines L1 and L2 so that a line determined by a pair of opposite corners M1 and M3 is generally perpendicular to the parallel lines L1 and L2. In other embodiments, the first chip and the second chip can be configured as other shapes, and the centers of the first chip and the second chip are respectively centrally located along the centerline between the parallel lines L1 and L2.

Figure 1:
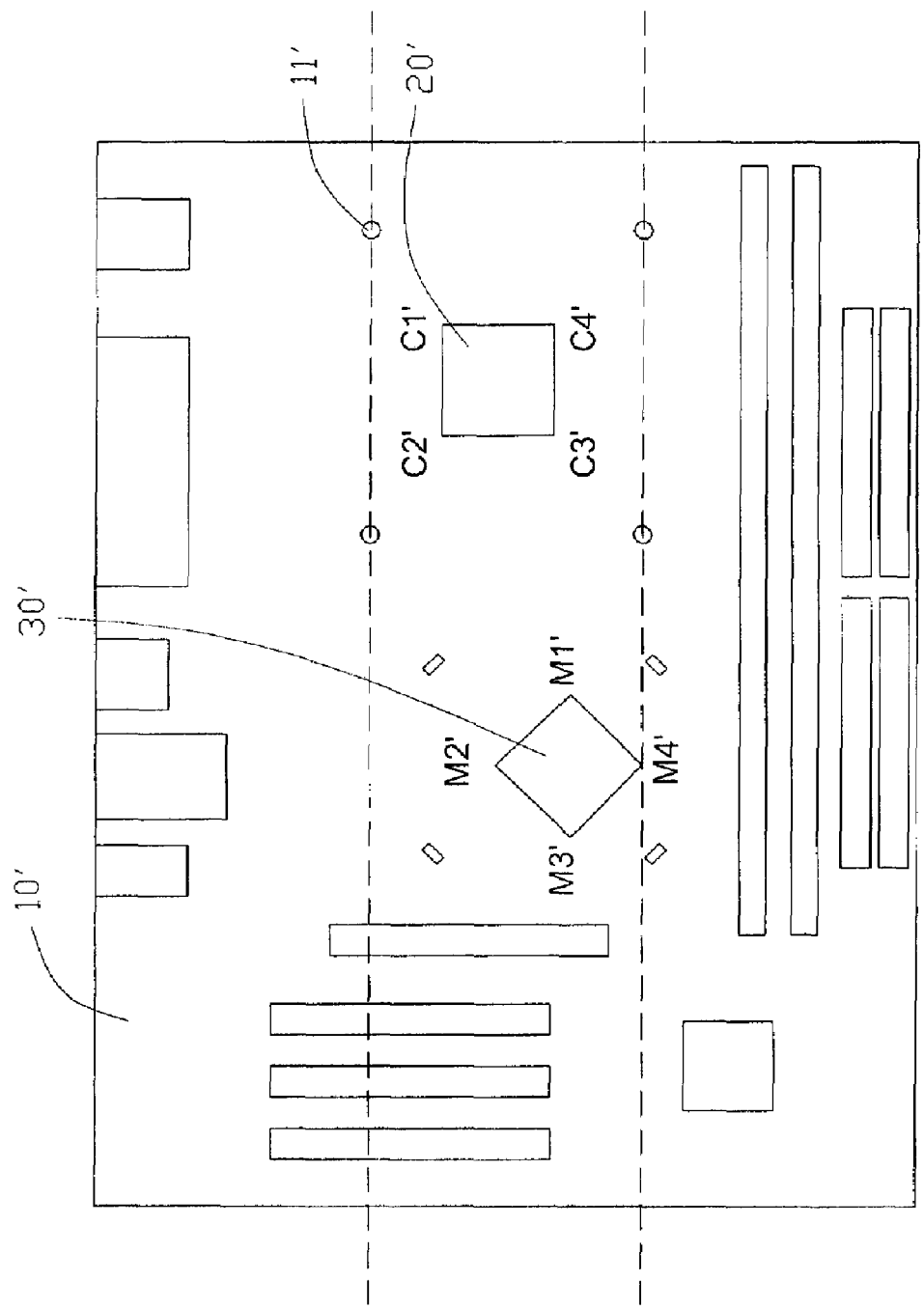
FIG. 1 is a top view of a conventional motherboard.

A software LS-DYNA is used for simulating stress distribution on the tin balls of the corners of the chips in FIG. 1 and FIG. 2 when the PCBs 10, 10' suffer an impact. A heat dissipating module is respectively mounted on the motherboard of FIG. 1 and FIG. 2. Simulation conditions are set as follows: the initial velocity of the PCBs 10, 10' is 4.86 meters/second when the PCBs 10, 10' suffer an impact, and a maximal acceleration of four corners of the PCBs 10, 10' is determined to be 45 gravities. Referring to FIG. 1, the corners of a CPU chip 20' corresponding to that in FIG. 2 are named as C1', C2', C3', and C4'. Four securing holes 11' are also defined in the motherboard 10' around the CPU chip 20'. The corners of a north bridge chip 30' corresponding to that in FIG. 2 are named as M1', M2', M3', and M4'. The corner M4' is located close to one of the parallel lines determined by two adjacent securing holes. The stress on the corners of the CPU chip 20' and north bridge chip 30' in the FIG. 1 during an impact is detailed in a table below:

| Corner | Stress in megapascals (Mpa) |
|---|---|
| C1' | 55 |
| C2' | 67 |
| C3' | 112 |
| C4' | 52 |
| M1' | 119 |
| M2' | 26 |
| M3' | 23 |
| M4' | 244 |

As can be seen in the above table, stress is not evenly distributed among the corners of the CPU chip 20' and north bridge chip 30'. Some corners suffer a great deal more stress than others, which may exceed the limited stress value the tin balls can undergo. Therefore, the tin balls located at these corners are easily damaged by impact to the PCB 10'.

The stress on the corners of the CPU chip 20 and north bridge chip 30 in the present motherboard of FIG. 2 during an impact is detailed in a table below:

| Corner | Stress in megapascals (Mpa) |
|---|---|
| C1 | 58 |
| C2 | 58 |
| C3 | 90 |

-continued

| Corner | Stress in megapascals (Mpa) |
|---|---|
| C4 | 56 |
| M1 | 78 |
| M2 | 22 |
| M3 | 82 |
| M4 | 72 |

According to the above table, stress at 72 megapascals on the corner M4 of the north bridge chip 30 is much less than the 244 Mpa that was placed on the corner M4'. Stress on the corners C3 of the CPU chip 20 and M1 of the north bridge chip 30 are also much less than their counterparts C3' and M1'. Moreover, it can be clearly seen that stress is much more evenly distributed among all the corners of the chips of the present motherboard during an impact compared to the original motherboard. Therefore, should the PCB 10 suffer an impact, chances that the tin balls between the chips and the PCB 10 will suffer damage are minimized or possibly eliminated with the present embodiment.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A motherboard, comprising:
a circuit board defining four securing holes;
a first chip disposed on the circuit board;
a second chip having four corners disposed on the circuit board; and
the four securing holes located around the first chip configured for mounting a heat dissipating module on the first chip, two of the securing holes determining a first line, and the other two securing holes determining a second line parallel to the first line, a diagonal line connecting two diagonal corners of the second chip located along a center line equidistant between the first line and the second line.

2. The motherboard as described in claim 1, wherein the first chip, is centrally located between the first line and the second line.

3. The motherboard as described in claim 2, wherein the first chip is square, and two opposite sides of the first chip are respectively parallel to the first line and the second line.

4. The motherboard as described in claim 1, wherein the second chip is square, and a line determined by the other two diagonal corners thereof is perpendicular to the first line and the second line.

5. The motherboard as described in claim 1, wherein the first chip is a central processing unit (CPU) chip.

6. The motherboard as described in claim 1, wherein the second chip is a north bridge chip.

7. A motherboard, comprising:
a circuit board;
a central processing unit (CPU) chip disposed on the circuit board;
two rows of securing holes defined in the circuit board and located at opposite sides of the CPU chip configured for securing a heat dissipating module on the CPU chip; and
a north bridge chip disposed on the circuit board between the two rows of securing holes, a diagonal line connecting two diagonal corners of the north bridge chip being parallel to the two lines defined by the two rows of securing holes, and distances between the diagonal line and the two lines being equal to each other.

* * * * *